(12) United States Patent
Darwish et al.

(10) Patent No.: US 7,960,783 B2
(45) Date of Patent: Jun. 14, 2011

(54) DEVICES CONTAINING PERMANENT CHARGE

(75) Inventors: Mohammed N. Darwish, Campbell, CA (US); Amit Paul, Sunnyvale, CA (US)

(73) Assignee: MaxPower Semiconductor Inc., Santa Clara, CA (US)

( * ) Notice: Subject to any disclaimer, the term of this patent is extended or adjusted under 35 U.S.C. 154(b) by 109 days.

(21) Appl. No.: 12/545,808

(22) Filed: Aug. 21, 2009

(65) Prior Publication Data

US 2010/0084704 A1  Apr. 8, 2010

Related U.S. Application Data

(60) Provisional application No. 61/091,442, filed on Aug. 25, 2008.

(51) Int. Cl.
*H01L 29/66* (2006.01)
(52) U.S. Cl. .................. 257/330; 257/E29.257
(58) Field of Classification Search .................. 257/330, 257/341, 488, 490, 495, E29.257
See application file for complete search history.

(56) References Cited

U.S. PATENT DOCUMENTS

| | | | |
|---|---|---|---|
| 5,282,018 A | 1/1994 | Hiraki et al. | |
| 5,637,898 A | 6/1997 | Baliga | |
| 5,864,159 A | 1/1999 | Takahashi | |
| 5,973,359 A | 10/1999 | Kobayashi | |
| 5,998,833 A | 12/1999 | Baliga | |
| 6,069,372 A | 5/2000 | Uenishi | |
| 6,114,727 A | 9/2000 | Ogura et al. | |
| 6,191,447 B1 | 2/2001 | Baliga | |
| 6,251,730 B1 | 6/2001 | Luo | |
| 6,388,286 B1 | 5/2002 | Baliga | |
| 6,525,373 B1 | 2/2003 | Kim | |
| 6,541,820 B1 | 4/2003 | Bol | |
| 6,649,975 B2 | 11/2003 | Baliga | |
| 6,686,244 B2 | 2/2004 | Blanchard | |
| 6,710,403 B2 | 3/2004 | Sapp | |
| 6,803,627 B2 | 10/2004 | Pfirsch | |
| 2001/0041407 A1 | 11/2001 | Brown | |
| 2002/0197786 A1 | 12/2002 | Cho et al. | |
| 2003/0203576 A1 | 10/2003 | Kitada et al. | |
| 2004/0121572 A1 | 6/2004 | Darwish et al. | |
| 2005/0176204 A1 | 8/2005 | Langdo et al. | |
| 2005/0285182 A1 | 12/2005 | Schuler | |
| 2006/0060916 A1 | 3/2006 | Girdhar et al. | |
| 2008/0023763 A1 | 1/2008 | Blanchard | |
| 2008/0164516 A1* | 7/2008 | Darwish | ........................ 257/329 |
| 2008/0191307 A1* | 8/2008 | Darwish | ........................ 257/493 |

OTHER PUBLICATIONS

J. T. Watt, B. J. Fishbein & J. D. Plummer; Low-Temperature NMOS Technology with Cesium-Implanted Load Devices; IEEE Trans. Electron Devices, vol. 34, # 1, Jan. 1987; p. 28-38.
J.T.Watt,B.J.Fishbein & J.D.Plummer;Characterization of Surface Mobility in MOS Structures Containing Interfacial Cesium Ions;IEEE Trans.Electron Devices,V36,Jan. 1989; p. 96-100.
J.R.Pfiester, J.R.Alvis & C.D.Gunderson; Gain-Enhanced LDD NMOS Device Using Cesium Implantation; IEEE Trans.Electron Devices, V39, #6, Jun. 1992; p. 1469-1476.
PCT/US09/54739 ISR/WO, Apr. 22, 2010, Mohamed N. Darwish.

* cited by examiner

*Primary Examiner* — Mark Prenty
(74) *Attorney, Agent, or Firm* — Robert O. Groover, III; Storm LLP

(57) ABSTRACT

An edge termination structure includes a final dielectric trench containing permanent charge. The final dielectric trench is surrounded by first conductivity type semiconductor material (doped by lateral outdiffusion from the trenches), which in turn is laterally surrounded by second conductivity type semiconductor material.

19 Claims, 15 Drawing Sheets

DEVICES CONTAINING PERMANENT CHARGE

CROSS-REFERENCE

Priority is claimed from U.S. provisional application 61/091,442 filed 25 Aug. 2008, which is hereby incorporated by reference.

BACKGROUND

The present application relates to semiconductor devices containing permanent charges, and more particularly to edge termination structures and methods.

Note that the points discussed below may reflect the hindsight gained from the disclosed inventions, and are not necessarily admitted to be prior art.

Permanent charges can be implanted into device material, supplied, for instance, by the implantation of certain atomic species, such as cesium, into a compatible material, such as silicon dioxide.

Embedded permanent charges have been used in the design of devices such as depletion mode vertical DMOS transistors. In published U.S. applications 2008/0191307 A1 and 2008/0164516, which are both hereby incorporated by reference, permanent or fixed charges were used to fabricate efficient high voltage devices with low specific on-resistance. (These published applications have overlapping inventorship, ownership and pendency with the present application, and are not admitted to be prior art.) FIGS. 1(a), 1(b), and 2 are generally based on these applications.

FIGS. 1(a) and 1(b) show examples of high voltage devices utilizing positive permanent charge. Permanent charge is included in a trench 104 filled with dielectric material 108. The devices may be constructed using a p+ layer 102 on a more lightly doped p layer 120 (which may be an epitaxial layer) On top of an N+ or N/N+ bottom layer 130.

The example in FIG. 1(a) is a high voltage diode. Here the front-side p-type diffusion 102 serves as an anode, and the backside N+ 130 (which may be the entire substrate) serves as a cathode. Under reverse bias the depletion zone at the junction 120/130 will spread mainly into p type layer 120. If the doping and thickness of layer 120 are chosen correctly, the electric field does not get high enough to cause breakdown at the rated operating voltage. Front-side and backside metallization 106/107 provide external connections.

FIG. 1(b) shows a similar bulk structure, with additional components which form an n-channel MOS transistor. In this structure the deep n+ diffusion 130 operates as a drain, and the p-type diffusion 102 provides a shallow body diffusion (or body contact diffusion). However, some important elements are added: a shallow and heavily doped n-type source region 150 lies between the source contact diffusions 102 and the trenches 104. A deep body diffusion 103 is preferably deeper than the body contact diffusion 102. An insulated gate 140 is located within the trench 104, and selectively inverts the nearest portions of the deep body diffusion 102 to control conduction. (Under OFF conditions, a depletion region will spread from the body junction 120/130.

In both of these embodiments the dielectric filled trenches with embedded permanent charges help to control the spread of the potential under reverse bias, i.e. they help to reduce peak electric field. As discussed in the two applications cited above, the use of permanent charge included in the trenches also helps to improve on-state conductivity at a specified breakdown voltage, Power semiconductor devices are often used in environments where transient voltages are inevitable. This can occur, for example, in motor drives, or other applications where inductance is present. A semiconductor material will "break down" (and become conductive) if the electric field becomes too high, and then typically remains conductive until the device is physically destroyed, or until the supplied current drops below a low holding current value. The area where breakdown occurs can therefore suddenly receive the entire energy stored in the system. In high-voltage devices of this kind, it is preferable that breakdown, when it occurs, should occur in the device array, since the device area has much larger area than the termination area.

A high-voltage power device structure must have some edge termination, to provide lateral space for the voltage drop between the source and drain terminals. (Conduction along the edge of the die is hard to prevent.) Thus it is highly desirable, especially with high-voltage devices, that the edge terminations should have a breakdown voltage similar to or greater than that of the device active area. FIG. 2 shows a simple termination structure 210 surrounding an active device area 220, where the active area might include diodes, JFETs, MOSFETs, IGBTs, or other device types. Such a structure might use p-on-n+ epitaxial material as a starting point. However, the presence of the thick P layer 120 in the edge termination area precludes the use of many conventional termination structures such as Field Plates, Guard Rings or Junction Termination Extension (JTE).

SUMMARY

The present application discloses new approaches to edge termination structures in semiconductor devices which include embedded permanent charges. Lateral out-diffusion from the trenches provides first-type (e.g. p-type) drift regions for the active devices, while allowing the use of a different type (e.g. n-on-n+) for the starting epitaxial material. The lateral out-diffusion also provides a junction surrounding the active area, so that the termination region can be built with surface material of the opposite conductivity type (e.g. n-type).

Note that this process can tolerate a fairly high diffusion length (integral root Dt), since this lateral diffusion is performed very early in the process, when no device structures have been formed yet. Moreover, only one ring of space per die is consumed by this lateral diffusion.

In various embodiments, this lateral out-diffusion is also applied to devices with more than one kind of trench in the active device area, and/or to devices with additional diffusion components in the total structure, and/or to devices with additional structural elements as described below.

One important teaching is that use of lateral out-diffusion to blanket the array at channel depth automatically results in a tapered doping to a vertical junction in the termination. This too tends to provide a lower peak |E| (electric field magnitude) at edge termination.

The disclosed innovations, in various embodiments, provide one or more of at least the following advantages. However, not all of these advantages result from every one of the innovations disclosed, and this list of advantages does not limit the various claimed inventions.

Use conventional termination structures in devices that include embedded permanent charges;
Area required for the termination is relatively small;
The termination structure may be formed at the same time as the active area is formed;

Breakdown, if it occurs, is less likely to occur in the peripheral area.

BRIEF DESCRIPTION OF THE DRAWINGS

The disclosed inventions will be described with reference to the accompanying drawings, which show important sample innovative embodiments and which are incorporated in the specification hereof by reference, wherein:

FIG. 1(*b*) is a cross-sectional structural diagram depicting a vertical MOSFET;

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

This application discloses a number of device structures using embedded permanent charges, a p-type material in the active area and an n-type layer at the periphery, allowing the use of conventional termination structures such as Field Plates, Guard Rings or junction termination extension (JTE).

Figure 1:
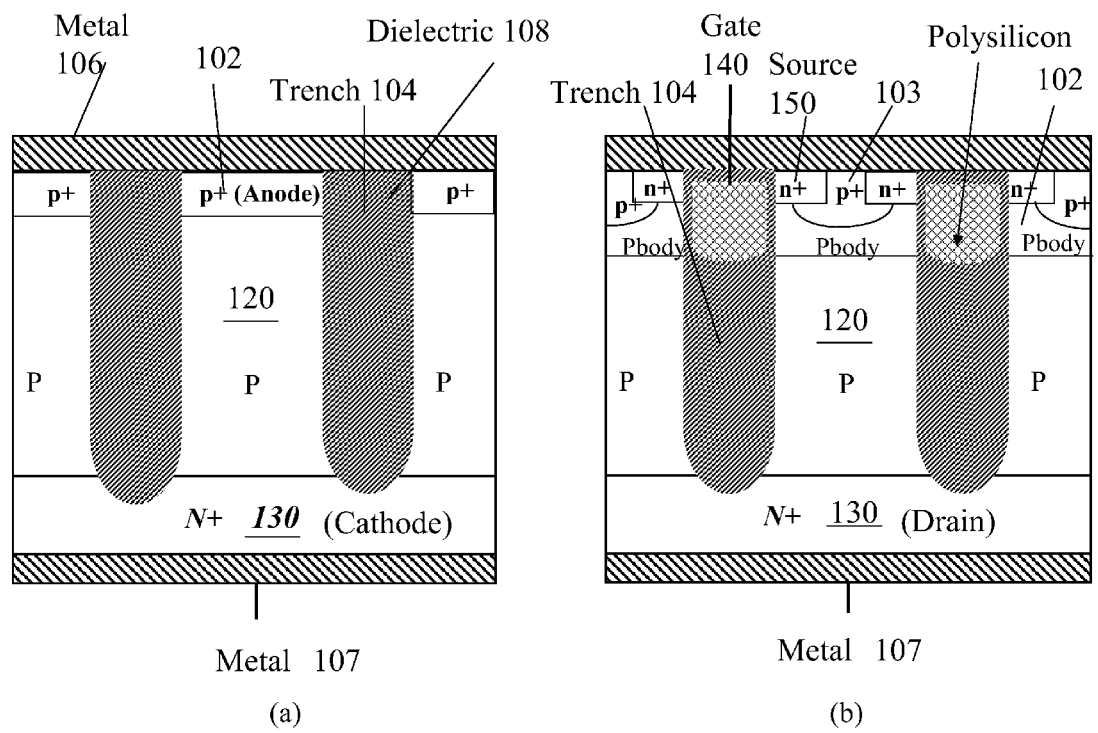
FIG. 1(*a*) is a cross-sectional structural diagram depicting a diode structure.
Figure 2:
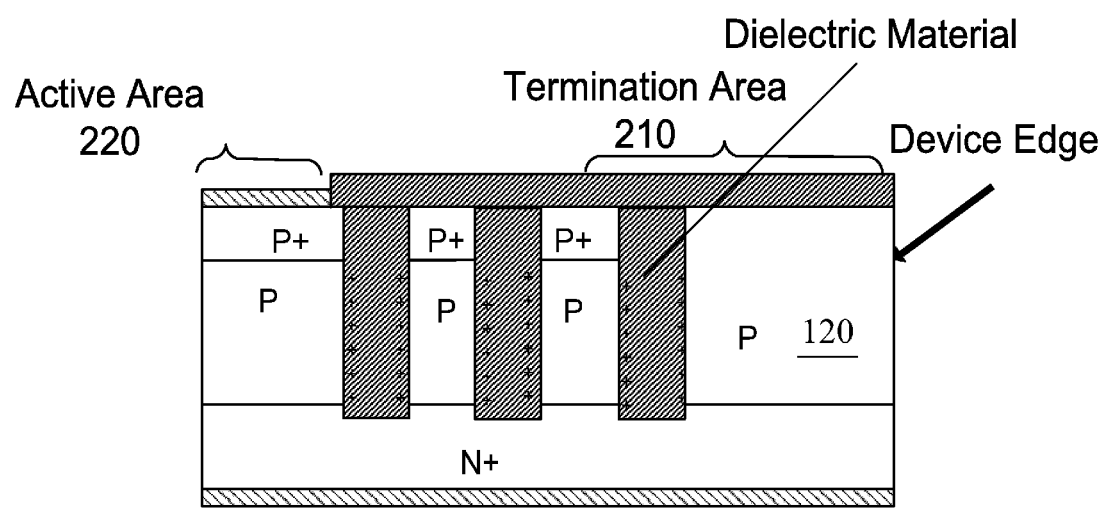
FIG. 2 is a cross-sectional structural diagram depicting an edge termination structure.
Figure 3:
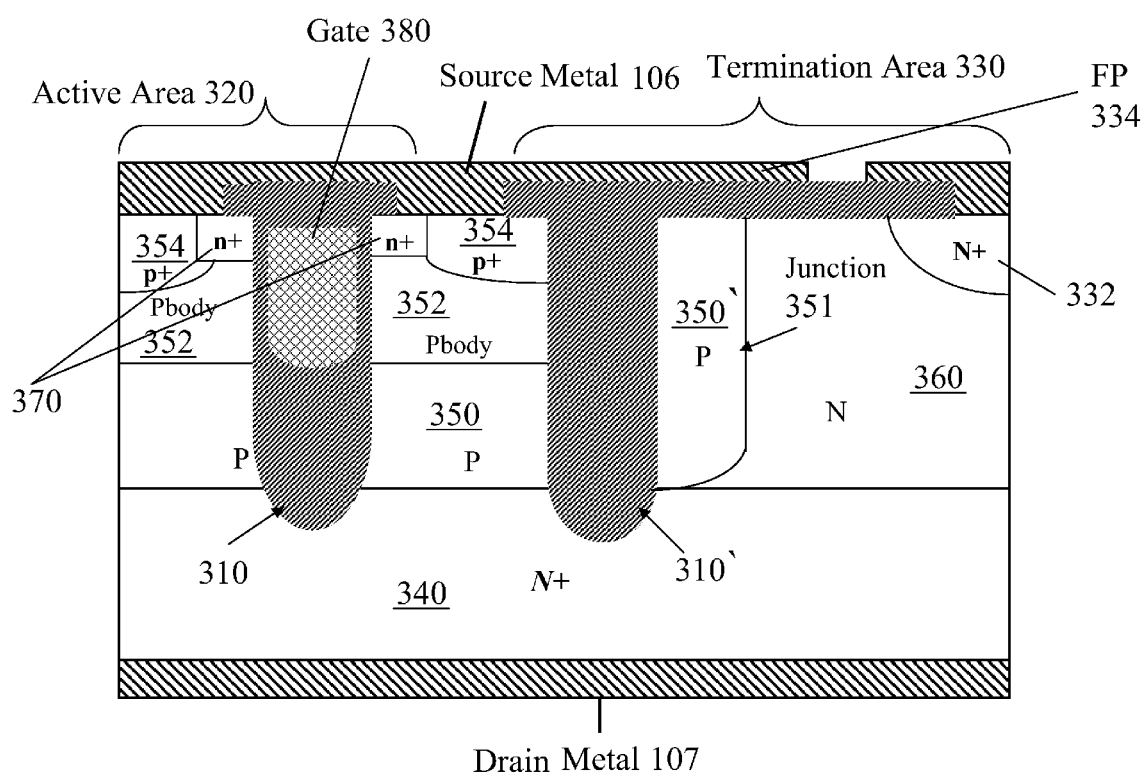
FIG. 3 is a cross-sectional structural diagram depicting an edge termination structure, in accordance with an embodiment.

FIG. 3 shows one innovative embodiment with an n-channel MOS transistor using positive permanent positive charge embedded in a dielectric filled trench 310 with N+ substrate 340, In the core or active area 320, P type region 350 lies on top of the N+ material 340. In the termination region 330, N+ material 340 is directly overlain by N-type semiconductor material 360. (In a sample embodiment, 340 can be the N+ semiconductor substrate, 360 can be the original n-type epitaxial layer, and p region 350 can be provided by lateral diffusion as described below.) At the periphery of the active area 320, p-type diffusion 350 will taper off laterally, until it reaches parity with the activated donor concentration in termination material 360 (at the substantially vertical junction 351). Gate electrode 380 controls the conductivity of the channel region, i.e. the semiconductor region where the gate 380 is capacitively coupled to the semiconductor material in P body 352. In this example the majority carriers are electrons, which (in the ON state) are emitted from source diffusion 370, pass through the channel portion of body 352, pass through the deeper p region 350, and reach drain diffusion 340, to provide a net electron flow from source 370 to drain 340 (and hence a net current from drain electrode 107 to source electrode 106). It is important to note that trenches 310 preferably include some permanent (immobile) charge at their sidewalls; thus when the transistor is ON, the portion of deep p diffusion 350 nearest the trenches 310 is preferably depleted or inverted to provide induced drain extensions. (The operation of this permanent charge is described in much greater detail in the applications cited below.)

The termination region 360 is preferably lightly doped, e.g. in the range of 5E15 cm$^{-3}$ to $1\times10^{14}$ cm$^{-3}$ (1E14 cm$^{-3}$), or even less. This low doping implies some difference in other processing sequences; for example, a channeled implant and long drive can be used to provide the p type doping component, in the active devices, which would normally be provided by the epi layer. In this case it is also preferable for the P region 350 to extend all the way to the N+ substrate 340; otherwise $R_{on}$ will increase significantly.

A junction termination region 330 is positioned adjacent to the final trench dielectric 310'. The termination includes a field plate 334 and a edge diffusion 332, here shown as an N+ diffusion. The source metallization is preferably extended to provide the field plate 334, as shown here, but other field plate configurations can of course be used. The diffusion 332 is contacted by a separate metallization, and can be the start of a conventional edge termination. For example, one implementation of this can have the field plate 334 extending toward the edge over increasing dielectric thickness in a stair step fashion; this permits the field plate to smooth the potential gradients in the semiconductor material nearest the junction, while avoiding any sharp change in potential at the outer edge of the field plate 334.

Figure 4:
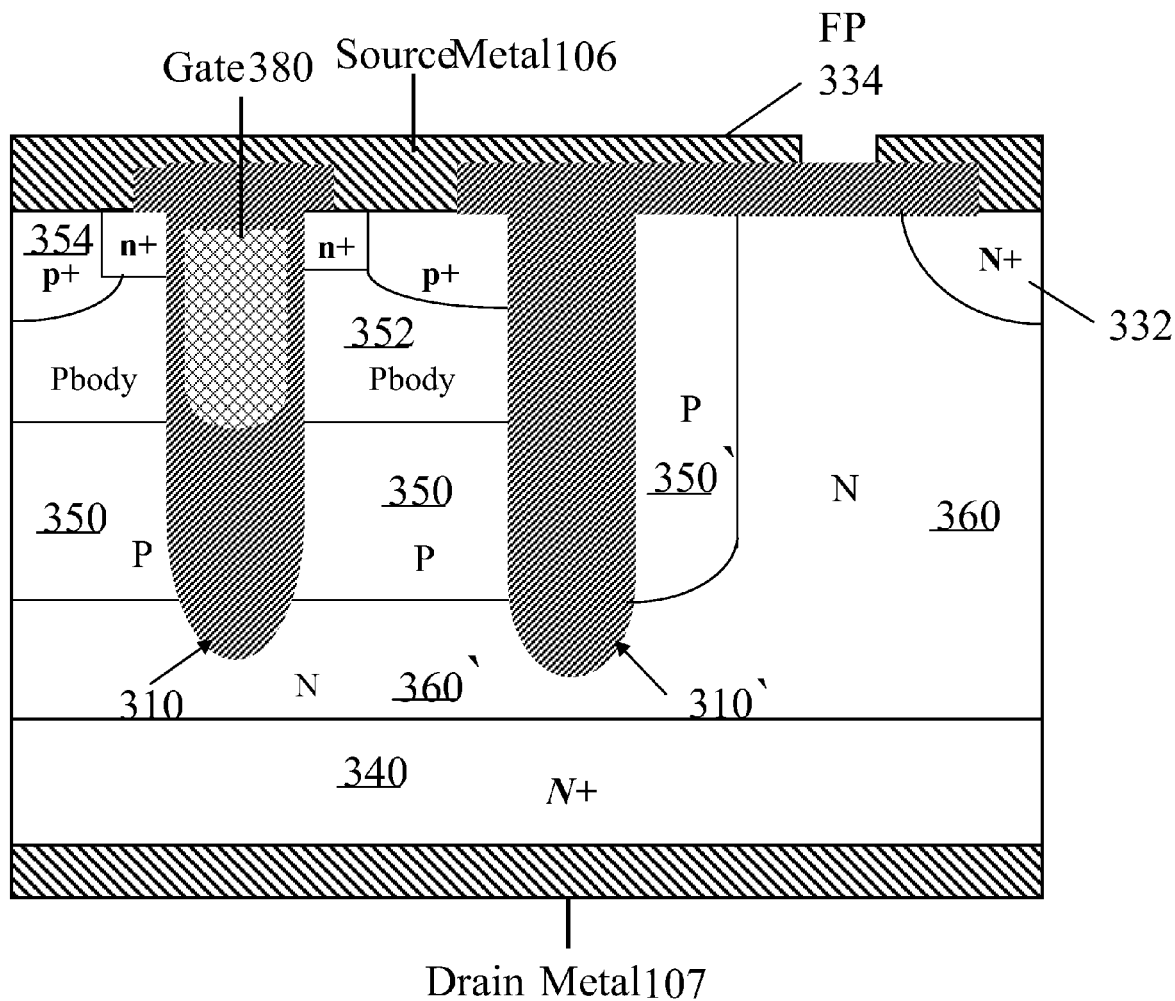
FIG. 4 is a cross-sectional structural diagram depicting an edge termination structure, in accordance with an embodiment.

FIG. 4 shows another embodiment that is similar to the previous one, except that here the trenches 310/310' do not reach N+ layer 340, nor (correspondingly) does p-type region 350. In this example the n-type region 360 (typically an epitaxial layer) has an extension 360' which lies beneath the trenches 310 and the deep p-type layer 350. In this example the extension 360' will operate as a shallow drain, and will tend to reduce the peak electric field at junction 350/360' in the OFF state.

Figure 5:
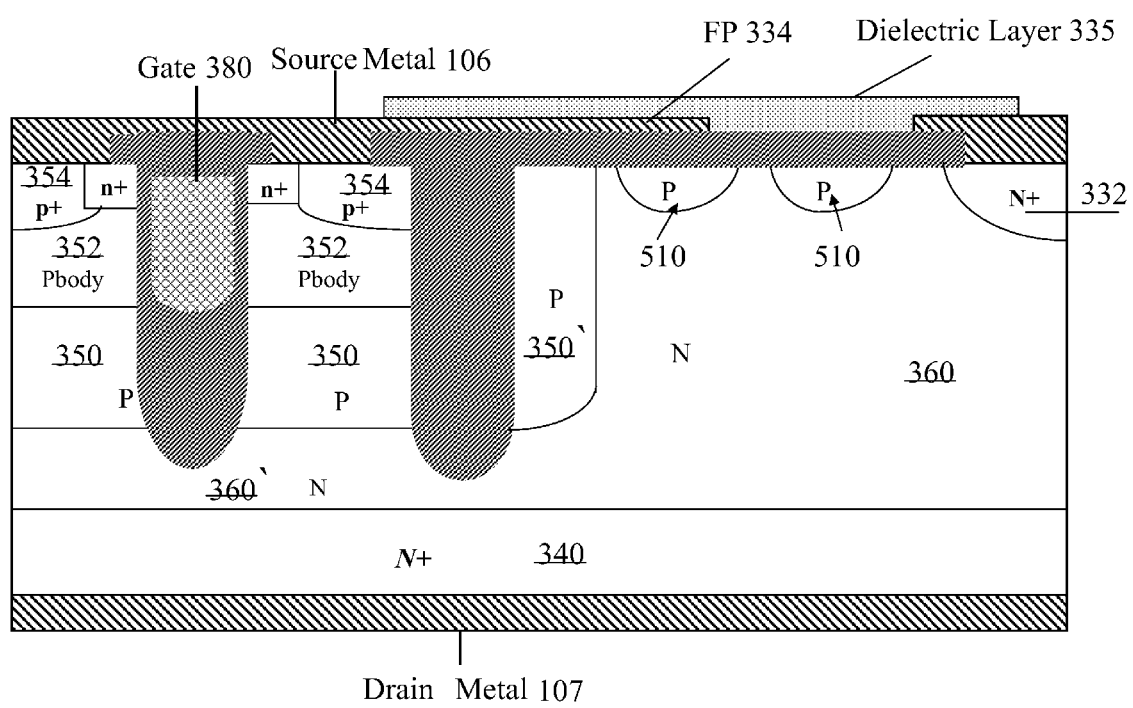
FIG. 5 is a cross-sectional structural diagram depicting an edge termination structure, in accordance with an embodiment.

FIG. 5 shows another innovative embodiment where floating P-type guard rings 510 are used in the termination. It should be noted that the surface of the device can be covered by an additional suitable dielectric material 335 such as silicon nitride or similar passivation layers. Such passivation layer was not shown in the previous figures for simplicity.

Figure 6:
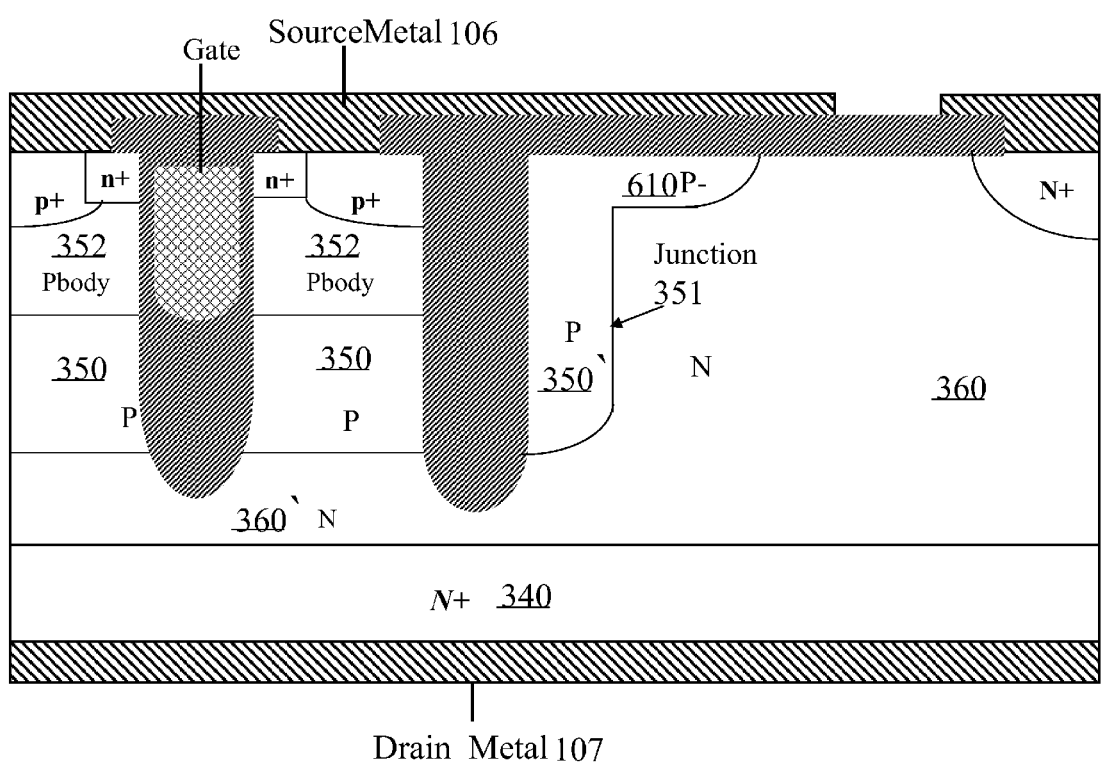
FIG. 6 is a cross-sectional structural diagram depicting an edge termination structure, in accordance with an embodiment.

FIG. 6 shows another innovative embodiment, which is somewhat similar to that shown in FIG. 5, but with the termination using junction termination extension techniques. The junction termination region 610 extends along the semiconductor surface, to laterally extend the edge component 350' beyond the vertical junction 351. This not only extends the potential gradient laterally, but also shapes the isopotential lines desirably. If the region 610 has an outdiffused profile, as shown, it will also have a graded doping density at the semiconductor surface. This further reduces electric field.

Figure 7:
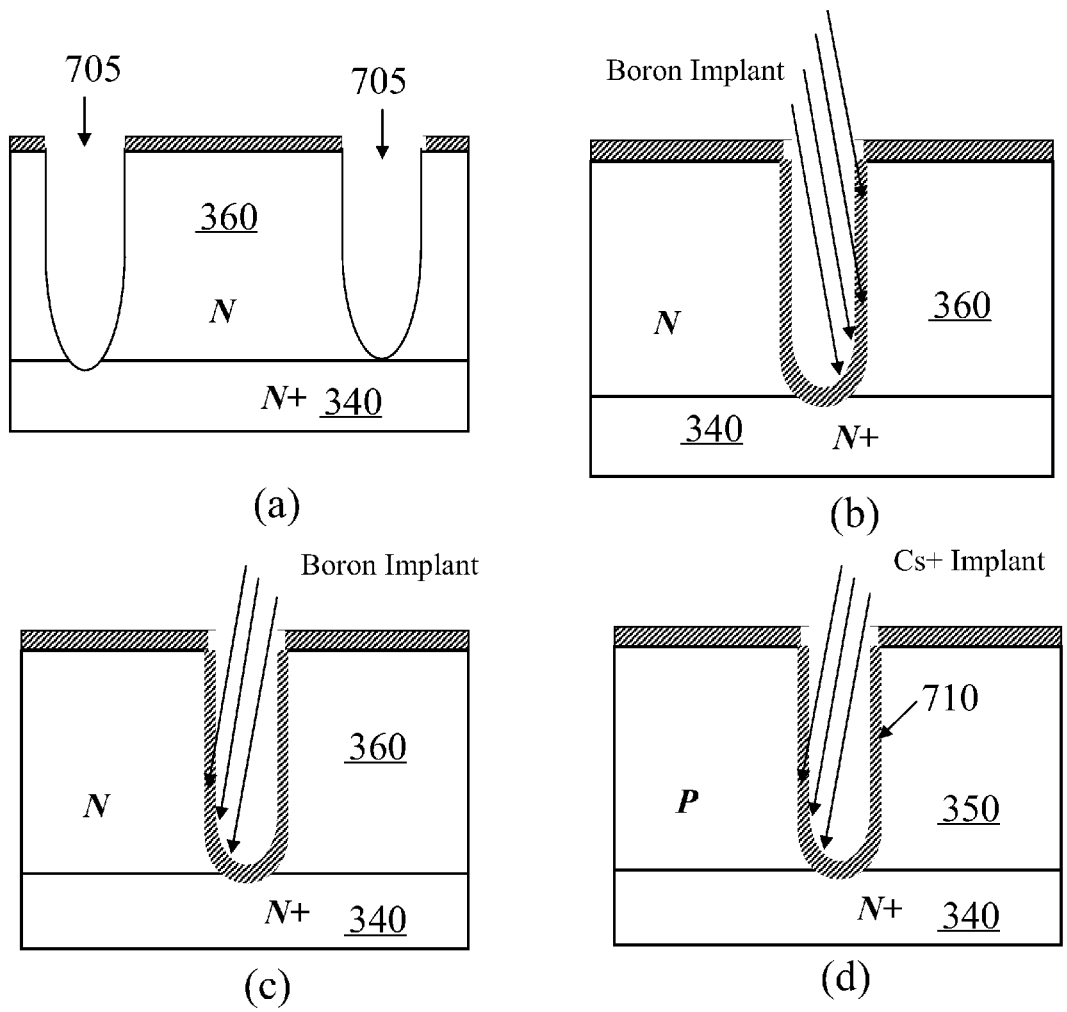
FIGS. 7(*a*)-(*f*) are a sequence of cross-sectional structural diagrams depicting stages of fabrication, in accordance with an embodiment.
Figure 7:
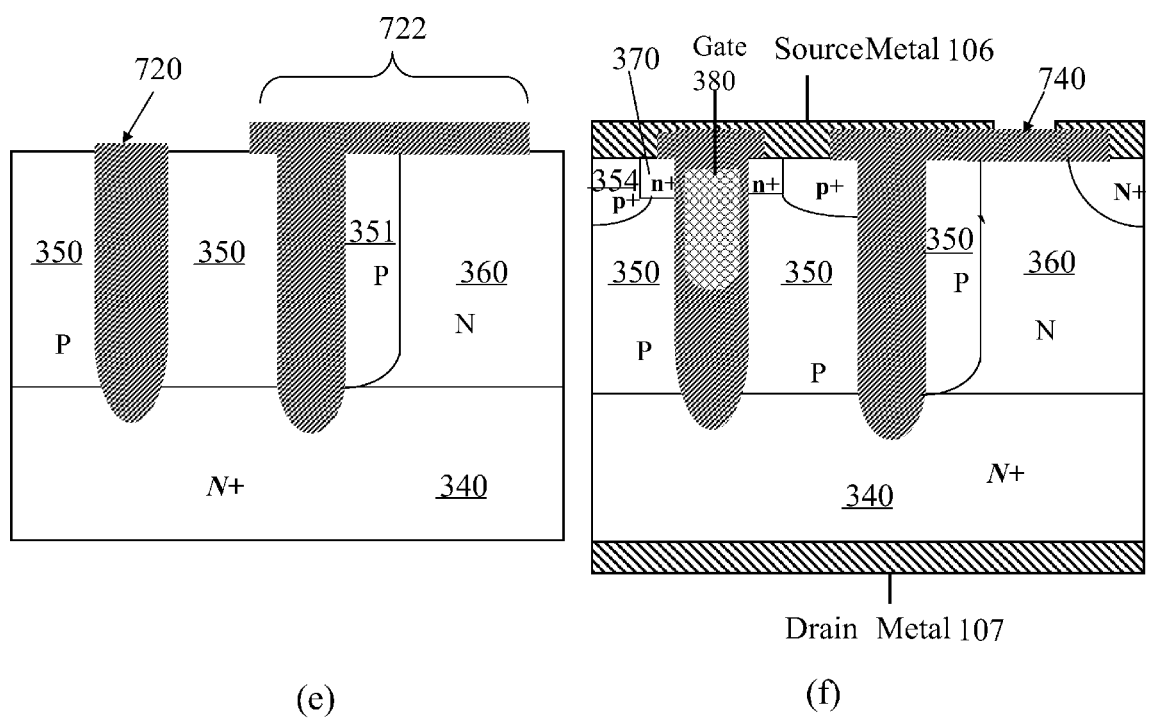

FIGS. 7(a)-(f) show one example of a fabrication method. Starting with an n-on-n+ structure (e.g. using epitaxial layer 360 on substrate 340), trenches 705 are etched as shown in FIG. 7(a). (These trenches may become the trenches 310 of FIG. 3, or may be subjected to further processing steps before then.) A dopant (such as boron 11 or $BF_2$)is angle-implanted so that it hits the trench walls, as shown in FIGS. 7(b) and 7(c). A drive-in step then outdiffuses and activates this implant, and is preferably continued for long enough that the lateral outdiffusion length is more than half of the minimum space between trenches. This means that this dopant component compensates the doping of the epitaxial layer 360, to form p-type diffusions 350 which replace the epi doping within the active array 320. This result is shown in FIG. 7(d). This also forms the graded last diffusion 350' which leads up to the vertical junction 351 at the edge of the active array, as shown in FIG. 3.

In another embodiment, an alternative method is used to provide the dopant source for the lateral outdiffusion. In this example, Vapor Phase Doping is used instead of implantation to provide the dopants for lateral outdiffusion from the trenches 705. Other conventional methods can also be used to provide this diffusion source.

A dielectric 710 (e.g. silicon dioxide) can now be formed (e.g. grown) on the sidewalls of the trenches 705, as also shown in FIG. 7(d). This dielectric 710 can then be angle-implanted with a source of permanent charge, e.g. cesium ions, to form the permanent charges used in this type of structure. Note that the angle of this implant does not have to be the same as the angle used in FIGS. 7(b) and 7(c). The angle of the implant will determine how much the bottom of the trench is shadowed by its own sidewalls. Other techniques can also be used to provide the permanent charge, as discussed below.

The trenches 705 can then be filled with dielectric 720 (e.g. silicon dioxide), and some dielectric cap structures 722 formed (e.g. of silicon dioxide or oxynitride), to produce the intermediate structure shown in FIG. 7(e).

Fabrication then is completed with steps to form sources 370, gates 380, body contacts 354, other components of the active device array if desired, and diffused rings in the periphery (e.g. 332, 510, etc.). FIG. 7(f) shows the resulting structure with N-type region 360 surrounding the P region 350 following further processing steps. In this particular example, note that the n+ ring diffusion 332 in the periphery is self-aligned to a dielectric cap layer 740.

Figure 8:
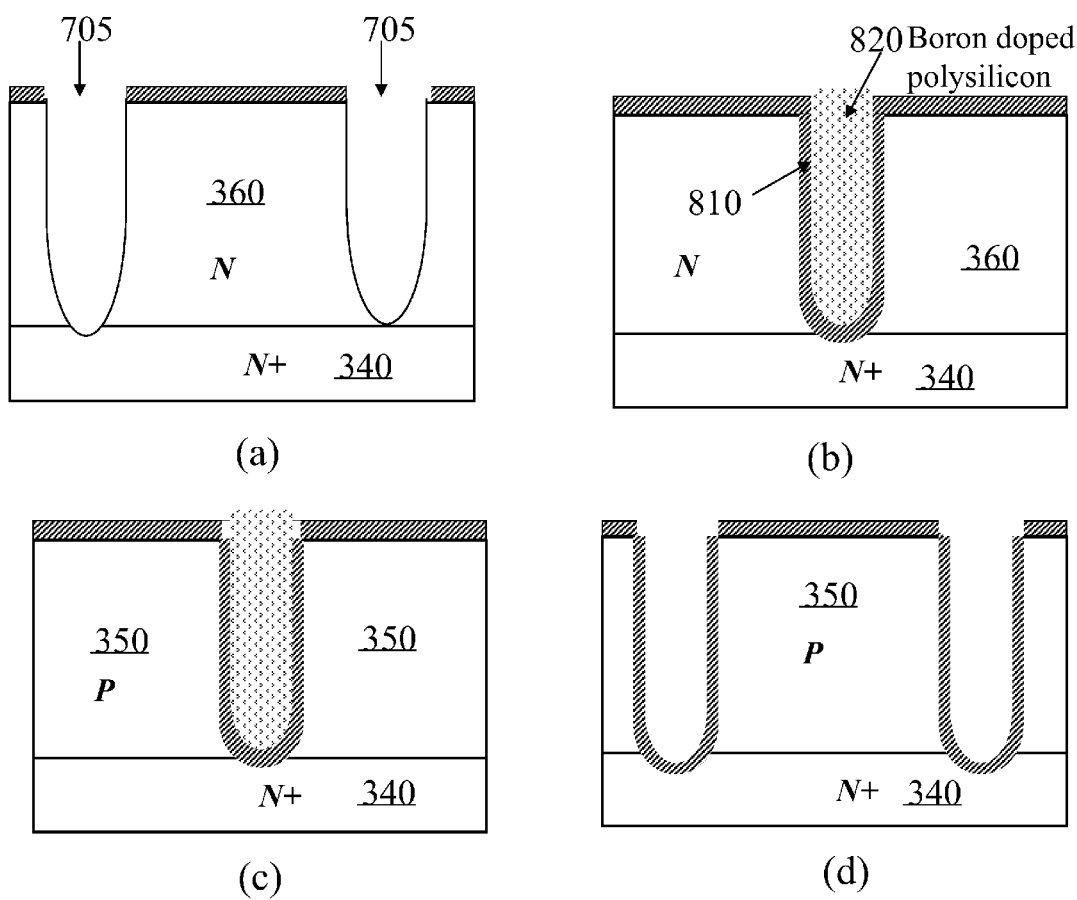
FIGS. 8(*a*)-(*d*) are a sequence of cross-sectional structural diagrams depicting stages of fabrication, in accordance with an embodiment.

FIGS. 8(a)-8(d) show an alternate method of fabrication. Again, the starting point, in this example, is an N-on-N+ epitaxial structure, and trenches 705 are etched to produce the starting structure shown in FIG. 8(a). A thin oxide layer 810 is grown on the trench walls, and a dopant source such as boron doped polysilicon) is deposited as shown in FIG. 8(b). (Optionally the boron can be preceded by deposition and etchback to form an oxide plug at the bottom of the trench, and/or the dopant source itself can be etched back vertically, so that the dopant source concentration varies vertically along the depth of the trench.)

A thermal drive step follows, so that dopant is outdiffused from the dopant source 820 to compensate the doping of epitaxial layer 360, and create the p-type region 350 within the active area (FIG. 8(c)). After the dopant source is stripped out (with the thin oxide 810 providing an etch stop), to produce open trenches in a doped active area, as shown in FIG. 8(d). This structure is closely analogous to FIG. 7(d), and processing can proceed analogously from that point.

Figure 9:
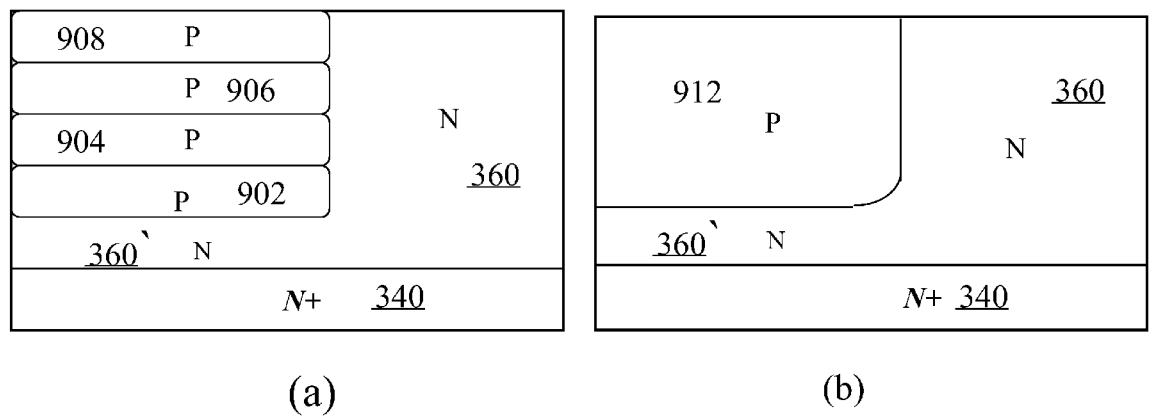
FIGS. 9(*a*)-(*b*) are a sequence of cross-sectional structural diagrams depicting stages of fabrication, in accordance with an embodiment.

FIGS. 9(a) and 9(b) show an alternate method of fabrication using a series of epitaxial growth and p-type diffusion steps. Again the starting structure is an N-on-N+ epitaxial structure, but the subsequent steps are extremely different from the sequences shown in FIGS. 7(a)-(f). and 8(a)-(d). In this example, a series of epitaxial growth followed by p-type implants and diffusion steps which successively form layers 902, 904, 906, and 908. In the example illustrated, four epitaxial growth steps are performed sequentially, and each is followed by p-type dopant introduction, such as by a boron implant step. (Before doping the as-grown material may be lightly doped n-type, e.g. due to updiffusion from the n-type underlying layer, or can be intrinsic or lightly-doped p-type.) This method adds some extra process burden, but does provide a high degree of control over the vertical doping profile in these p-type regions 902/904/906/908, since each is separately doped. As shown in FIG. 9(b), the result after annealing is to provide a thick p-type layer 912. Trenches of one or more types can then be cut into the thick p-type layer 912, to permit fabrication of active devices just as if the starting material had been p-on-n-on-n+. Note, however, that the active area is surrounded by an n-on-n+ structure in the termination area, which has advantages as discussed above.

Figure 10:
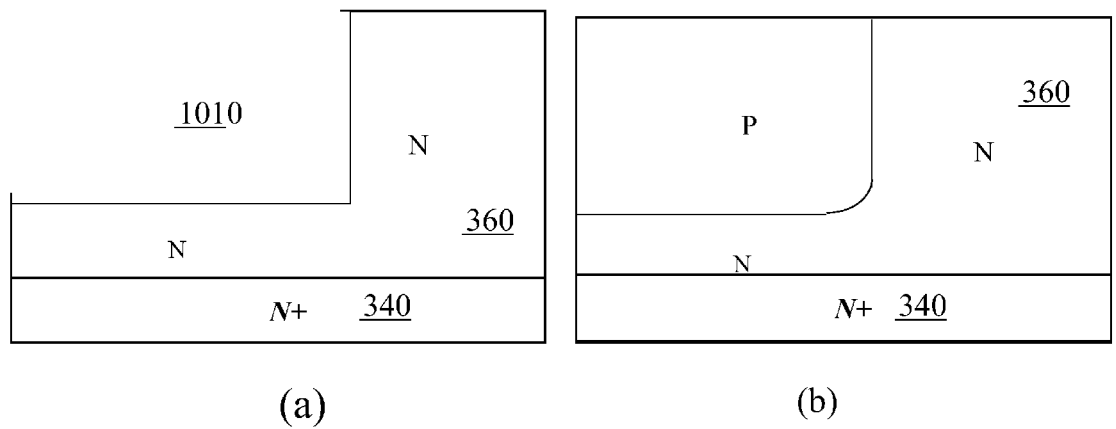
FIGS. 10(*a*)-(*b*) are a sequence of cross-sectional structural diagrams depicting stages of fabrication, in accordance with an embodiment.

In yet another embodiment, a single epitaxial growth step is used to form p-type material in the etched recess. In this method a recess 1010 is cut into the n-type epitaxial layer 360, to produce a starting structure like that of FIG. 10(a). FIG. 10(b) shows how the recess 1010 can be filled by a epitaxial growth step with in-situ doping. Optionally a selective epitaxial growth technique can be used, and/or a CMP step can be used to remove overgrowth. Doping of the recess-filling material 130 can be controlled by using in-situ doping, or by using high-energy implant and drive steps. Note that FIG. 10(b) appears approximately identical to FIG. 9(b), but the process sequence is quite different.

Figure 11:
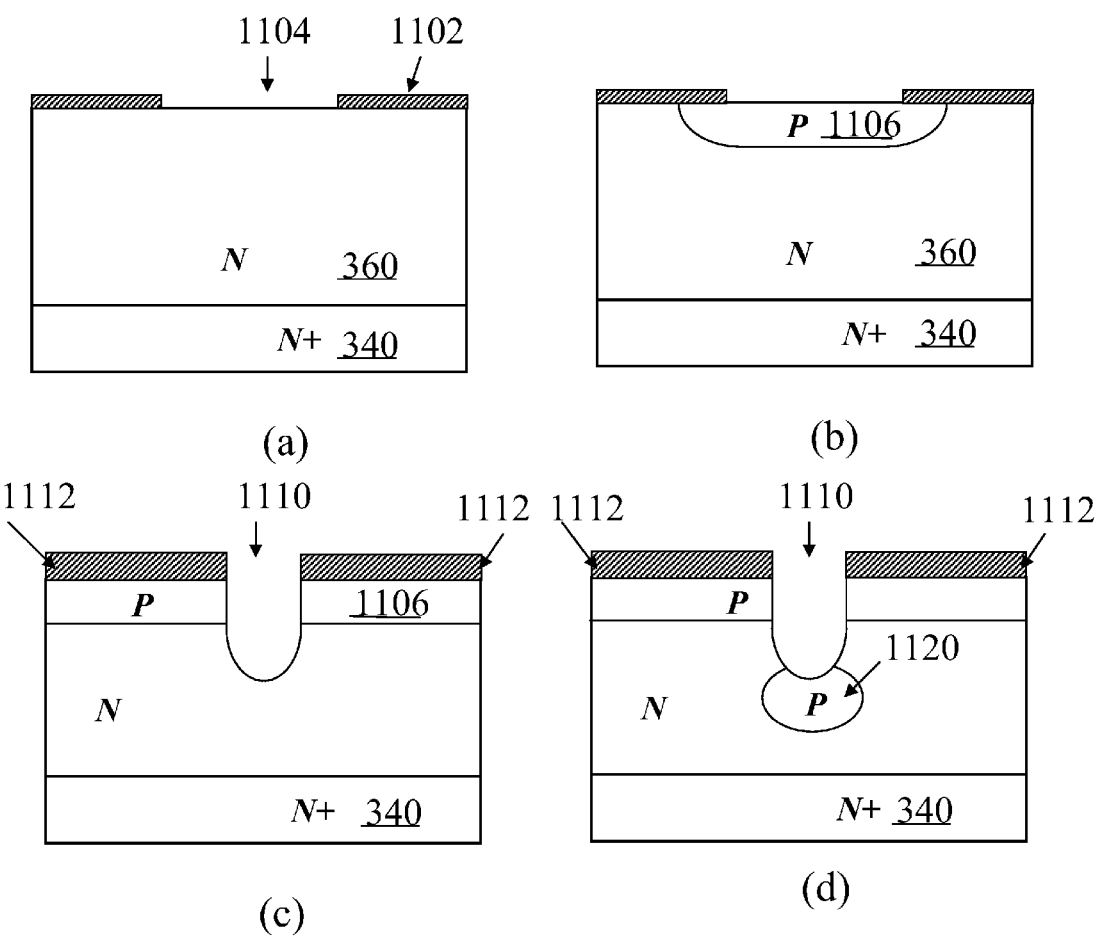
FIGS. 11(*a*)-(*p*) are a sequence of drawings showing an example of fabrication, in accordance with an embodiment, including alternatives.
Figure 11:
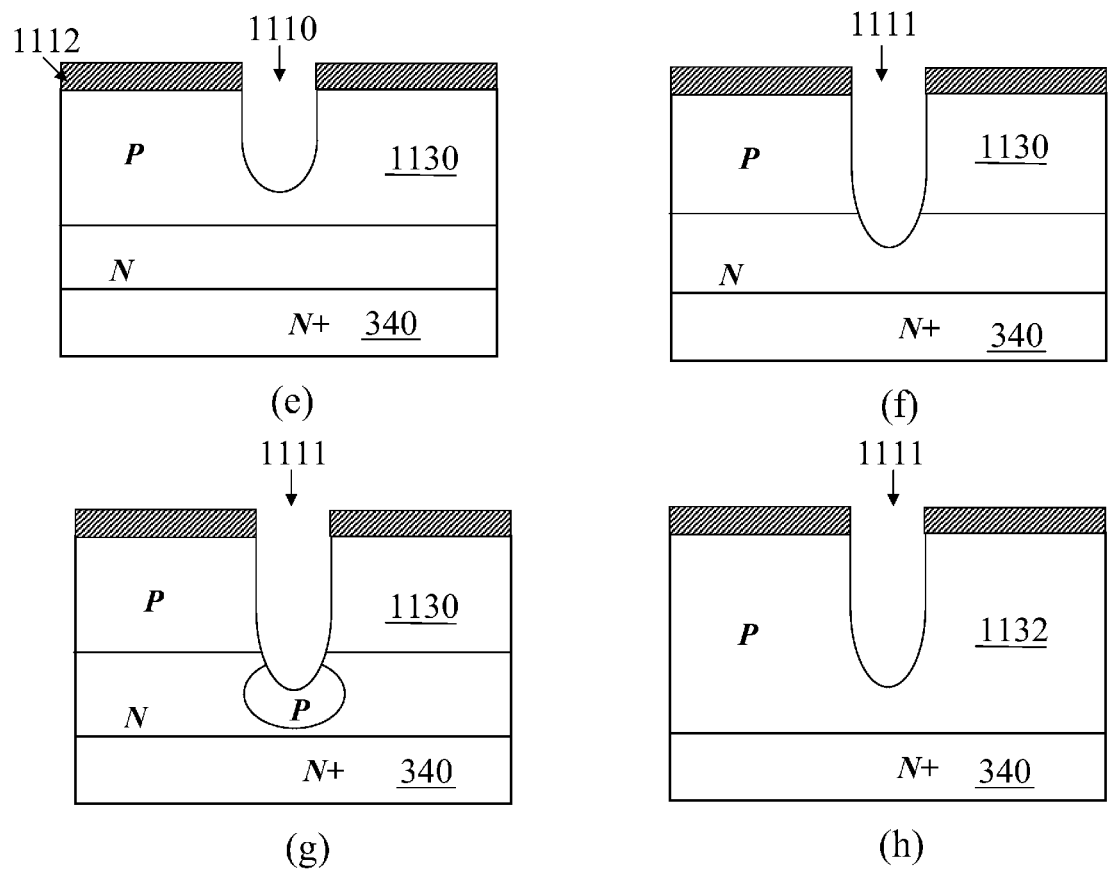
Figure 11:
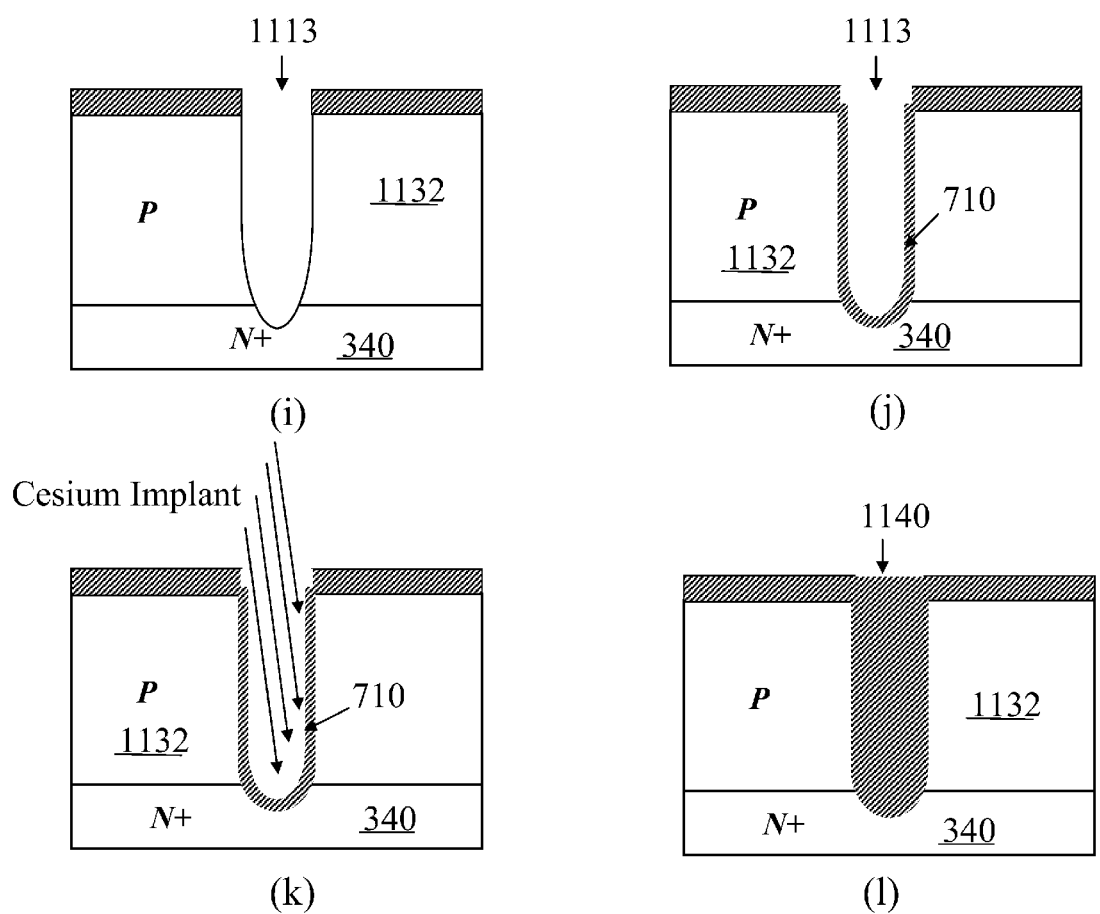
Figure 11:
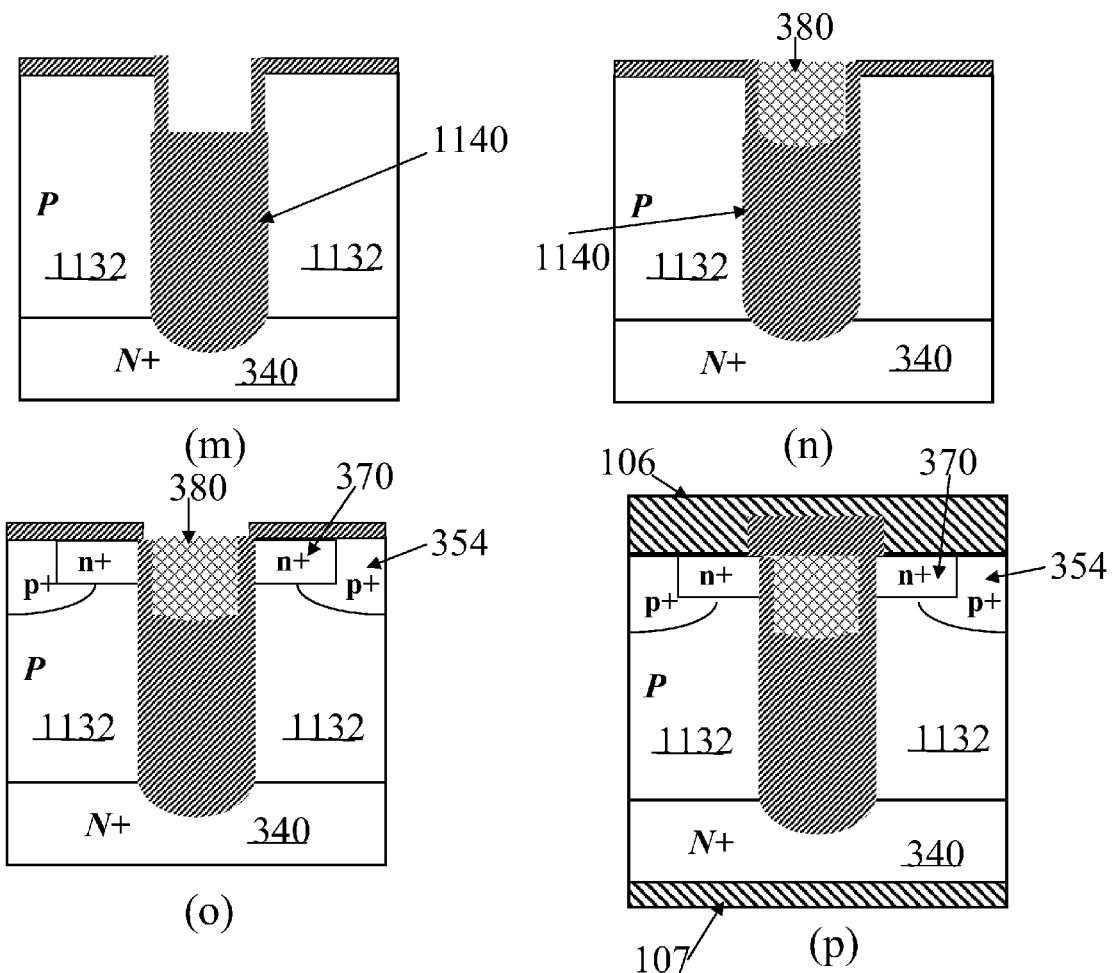

FIGS. 11(a)-(p) show another class of embodiments for forming the p layer, including alternatives. In FIG. 11(a), a hardmask 1102 has been patterned on a n/n+ epi structure 360/340, to define locations 1104 where p-type doping is desired. This will include p-body locations, and can optionally include the entire active device area of the chip. (Optionally a photoresist layer can be used to define this implant)

In FIG. 11(b) the p-type dopant has been implanted (or otherwise introduced) and annealed, to form a (relatively) shallow p-type diffusion 1106.

FIG. 11(c) shows a view within the active device area (assuming that diffusion 1106 is extensive). In this Figure another hardmask 1112 defines trench locations, and shallow trenches 1110 have been etched.

FIG. 11(d) shows a later step, after p-type dopants have been implanted into the shallow trenches 1110, to produce a concentration of acceptors 1120 below the bottom of the trench. If the trench pitch is tight enough, annealing of these dopants, in combination with the existing doping component 1106, will produce a fairly uniform p-type layer 1130, as shown in FIG. 11(e).

Since the hardmask 1112 is still in place, a further trench etch (see FIG. 11(f)), implant (see FIG. 11(g)), and anneal can now be performed, to provide a deeper p-type layer 1132 which extends below the deeper trench 1111, as shown in FIG. 11(h). In this example the deeper layer 1132 is shown extending down to the substrate 340, but of course more iterations can be used if desired.

As shown in FIG. 11(i), another trench etch produces the full-depth trench 1113. Trench 1113 is shown penetrating into the n+ substrate 340. A thin dielectric layer 710 can now be formed, e.g. by growth of silicon dioxide, to produce the structure of FIG. 11(j). The thin dielectric 710 can now be implanted with a permanent charge species, e.g. cesium (if the dielectric is silicon dioxide), as shown in FIG. 11(k). Of course, other process steps can also be used to introduce permanent charge.

The trench 1113 is now filled with a dielectric 1140, e.g. $SiO_2$, for example by deposition (FIG. 11(l)). An anisotropic etchback (FIG. 11(m)) is followed by forming gate oxide and a polysilicon (or the like) fill and planarization. A shallow n+ implant then forms the n+ source diffusions 370, and adds to the doping of the poly gate 380 (FIG. 11(n)). This provides the gate pattern.

A dielectric top cap is now emplaced and patterned (FIG. 11(o)), and body contact diffusions 354 are now implanted and annealed. This results in the structure of FIG. 11(p).

According to various disclosed embodiments, there is also provided: a high-voltage solid-state device, comprising: an array of active device portions, containing at least some trenches which have added permanent charge on sidewalls thereof, and are laterally surrounded, for the majority of their vertical extent, by semiconductor material which is doped with a first conductivity type; and a termination structure which surrounds said array, and which includes a final dielectric trench containing permanent charge: wherein said final dielectric trench is surrounded by said material of said first conductivity type, and wherein doping of said material tapers off laterally to a junction, and said material outside of said junction is predominantly of a second conductivity type.

According to various disclosed embodiments, there is also provided: a high-voltage solid-state device, comprising: an array of active device portions, containing at least some trenches which include gate electrodes, and have added permanent charge on sidewalls thereof, and are laterally surrounded, for the majority of their vertical extent, by semiconductor material which is doped with a first conductivity type and is capacitively coupled, at least in part, to ones of said gate electrodes; and a termination structure which surrounds said array, and which includes a final dielectric trench which contains permanent charge and which has approximately the same depth as said trenches in said array: wherein said final dielectric trench is surrounded by said material of said first conductivity type, and wherein doping of said material tapers off laterally to a predominantly vertical junction, and said material outside of said junction is predominantly of a second conductivity type.

According to various disclosed embodiments, there is also provided: a high-voltage solid-state device, comprising: an array of active device portions, containing first trenches which have added permanent charge on sidewalls thereof, and contain conductive gate electrodes, and are laterally surrounded, for at least some of their vertical extent, by semiconductor material which is doped with a first conductivity type; and also source diffusions of a second conductivity type, at least partly overlying said semiconductor material which laterally surrounds ones of said first trenches; and second trenches which are different from said first trenches; and a termination structure which laterally surrounds said array, and which includes a final dielectric trench which is also surrounded by said material of said first conductivity type, and wherein doping of said material tapers off laterally to a substantially vertical junction, and wherein said termination structure also contains peak-field-reducing structures outside said junction.

According to various disclosed embodiments, there is also provided: a edge termination structure comprising: a final dielectric trench containing permanent charge: a junction region adjacent said final dielectric trench, said junction region having a first conductivity type; and a termination region having a second conductivity type forming a termination junction with the junction region; wherein said termination structure region includes at least one guard ring and at least one field plate.

According to various disclosed embodiments, there is also provided: an edge termination structure comprising: a final dielectric trench containing permanent charge: a junction region adjacent said final dielectric trench, said junction region having a first conductivity type; a termination region having a second conductivity type and forming a termination junction with the junction region; and a guard ring structure within said termination region.

According to various disclosed embodiments, there is also provided: an edge termination structure comprising: a final dielectric trench containing permanent charge: a junction region adjacent said final dielectric trench, said junction region having a first conductivity type; a termination region having a second conductivity type and forming a termination junction with the junction region; wherein said junction termination region extends into said termination region with decreasing doping density.

According to various disclosed embodiments, there is also provided: a method of operating a power semiconductor device, comprising the actions of: controlling carrier flow through an array of active device portions, said array containing at least some trenches which have added permanent charge on sidewalls thereof, and are laterally surrounded, for the majority of their vertical extent, by semiconductor material which is doped with a first conductivity type; and dropping voltage difference between front-side and backside contacts through a termination structure which surrounds said array, and which includes a final dielectric trench containing permanent charge: wherein said final dielectric trench is surrounded by said material of said first conductivity type, and wherein doping of said material tapers off laterally to a junction, and said material outside of said junction is predominantly of a second conductivity type.

According to various disclosed embodiments, there is also provided: a method of operating a power semiconductor device, comprising the actions of: controlling vertical carrier flow through an array of active device portions, said array containing at least some trenches which include gate electrodes, and have added permanent charge on sidewalls thereof, and are laterally surrounded, for the majority of their vertical extent, by semiconductor material which is doped with a first conductivity type and is capacitively coupled, at least in part, to ones of said gate electrodes; and dropping voltage difference between front-side and backside contacts through a termination structure which surrounds said array, and which includes a final dielectric trench which contains permanent charge and which has approximately the same depth as said trenches in said array: wherein said final dielectric trench is surrounded by said material of said first conductivity type, and wherein doping of said material tapers off laterally to a predominantly vertical junction, and said material outside of said junction is predominantly of a second conductivity type.

According to various disclosed embodiments, there is also provided: a method of operating a power semiconductor device, comprising the actions of: controlling vertical carrier flow through an array of active device portions, said array containing first trenches which have added permanent charge on sidewalls thereof, and contain conductive gate electrodes, and are laterally surrounded, for at least some of their vertical extent, by semiconductor material which is doped with a first conductivity type; and also injecting majority carriers into said first conductivity type material, when said gate electrodes turn conduction on, from source diffusions of a second conductivity type, which at least partly overlying said semiconductor material which laterally surrounds ones of said first trenches; and second trenches which are different from said first trenches; and dropping voltage difference between frontside and backside contacts through a termination structure which laterally surrounds said array, and which includes a final dielectric trench which is also surrounded by said material of said first conductivity type, and wherein doping of said material tapers off laterally to a substantially vertical junction, and wherein said termination structure also contains peak-field-reducing structures outside said junction.

According to various disclosed embodiments, there is also provided: a method of fabricating an edge termination structure comprising forming a doped layer on top of a more heavily doped layer; etching a trench in said doped layer; implanting an impurity along walls of said trench; diffusing the impurity to form a diffusion region; and implanting permanent charge in said trench. According to various disclosed embodiments, there is also provided: a method of fabricating an edge termination structure comprising: forming a doped layer on top of a more heavily doped layer; etching a trench in said doped layer;

forming an insulating layer within said trench; and diffusing an impurity having a first conductivity type to said doped layer through said insulating layer, and forming a first diffusion and second diffusion in said doped layer.

According to various disclosed embodiments, there is also provided: a method as above, method of fabricating an edge termination structure comprising: forming a doped layer on top of a more heavily doped layer; etching a recess having substantially vertical sidewalls into said doped layer; and depositing at least one epitaxial layer; and introducing an impurity into said epitaxial layer.

According to various disclosed embodiments, there is also provided: a method of fabricating an edge termination structure comprising: forming a doped layer on top of a more heavily doped layer; forming a sequence of epitaxial growth and doped regions to form a collective region; and introducing an impurity to said collective region.

According to various disclosed embodiments, there is also provided: a method of fabricating an edge termination structure comprising: forming a doped layer on top of a more heavily doped layer; etching a trench in said doped layer; and growing an oxide layer within said trench; forming an epitaxial region filling the trench using a selective epitaxial growth technique; and introducing an impurity to said epitaxial region.

According to various disclosed embodiments, there is also provided: a device as above, wherein said final trench is structurally similar to said first trenches, but not said second trenches.

According to various disclosed embodiments, there is also provided: a device as above, wherein said final trench is structurally similar to said second trenches, but not to said first trenches.

According to various disclosed embodiments, there is also provided: a device as above, wherein said permanent charge is provided by immobile cesium ions.

According to various disclosed embodiments, there is also provided: a device as above, wherein said termination structure further comprises at least one field plate.

According to various disclosed embodiments, there is also provided: a device as above, wherein said termination structure extends substantially out to the edge of the semiconductor material in which said device is built.

According to various disclosed embodiments, there is also provided: a device as above, wherein said termination structure includes at least one diffused guard ring.

According to various disclosed embodiments, there is also provided: a device as above, wherein said termination structure includes both p+ and n+ guard rings.

According to various disclosed embodiments, there is also provided: a device as above, wherein said junction is predominantly vertical.

According to various disclosed embodiments, there is also provided: a device as above, wherein said first conductivity type is p-type.

According to various disclosed embodiments, there is also provided: a method as above, wherein said permanent charge is provided by immobile cesium ions.

According to various disclosed embodiments, there is also provided: a method as above, wherein said termination structure further comprises a field plate.

According to various disclosed embodiments, there is also provided: a method as above, wherein said termination structure extends substantially out to the edge of the semiconductor material in which said device is built.

According to various disclosed embodiments, there is also provided: a method as above, wherein said termination structure includes at least one diffused guard ring.

According to various disclosed embodiments, there is also provided: a method as above, wherein said termination structure includes both p+ and n+ guard rings.

According to various disclosed embodiments, there is also provided: a method as above, wherein said junction is predominantly vertical.

According to various disclosed embodiments, there is also provided: a method as above, wherein said first conductivity type is p-type.

According to various disclosed embodiments, there is also provided: a method as above, wherein said trenches within said array include conductive gate electrodes.

According to various disclosed embodiments, there is also provided: a method as above, wherein some of said trenches within said array include conductive gate electrodes, and others of said trenches within said array do not.

According to various disclosed embodiments, there is also provided an edge termination structure includes a final dielectric trench containing permanent charge. The final dielectric trench is surrounded by first conductivity type semiconductor material (doped by lateral outdiffusion from the trenches), which in turn is laterally surrounded by second conductivity type semiconductor material.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

The doping levels needed to achieve high breakdown and low-resistance are governed by the well known charge balance condition. The specific electrical characteristics of devices fabricated using the methods described in this disclosure depend on a number of factors including the thickness of the layers, their doping levels, the materials being used, the geometry of the layout, etc. One of ordinary skill in the art will realize that simulation, experimentation, or a combination thereof can be used to determine the design parameters needed to operate as intended.

While the figures shown in this disclosure are qualitatively correct, the geometries used in practice may differ and should not be considered a limitation in anyway. It is understood by those of ordinary skill in the art that the actual cell layout will vary depending on the specifics of the implementation and any depictions illustrated herein should not be considered a limitation in any way.

While only n-channel MOSFETs are shown here, p-channel MOSFETs are realizable with this invention simply by changing the polarity of the permanent charge and swapping n-type and p-type regions in any of the figures. This is well known by those of ordinary skill in the art.

Additionally while MOSFETs are shown, many other device structures are implementable using this invention including diodes, IGBTs, thyristors, JFETs, BJTs, and the like.

The disclosed innovations are also applicable to recessed field plate (RFP) devices, and/or to other active device structures which include more than one kind of trench in the active device area.

In a further class of alternatives, the outermost trench at the edge of the active device array can be different from the trenches in the array structure.

in the above drawings that the positive and permanent charge is only conceptually depicted, for illustration purpose only. It is understood that the charge can be in the dielectric (oxide), at the interface between the silicon and oxide , inside the silicon layer or a combination of all these cases.

It is also understood that numerous combinations of the above embodiments can be realized.

It is understood by those of ordinary skill in the art that other variations to the above embodiments can be realized using other known termination techniques.

It is also understood that the N+ substrate can be replaced by an N/N+ layers such that the trench bottom in the above figures extends to the N layer located above the N+ layer.

It is also understood that this invention is also valid if the opposite polarity of the permanent charge the semiconductor dopings are used, e.g. negative permanent charge combined with outdiffusion of n-type dopants from a gate trench.

The following commonly owned U.S. applications may contain additional information regarding alternatives and modifications, and are all hereby incorporated by reference: 61/027,699, 61/028,790, 61/028,783, 61/058,069, 61/060,488, 61/074,162, 61/076,767, 61/080,702, 61/084,639, 61/084,642, 61/125,892, 61/118,664, 61/122,794, None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A high-voltage solid-state device, comprising:
   an array of active device portions, containing at least some trenches which have added permanent charge therein, and
   are laterally surrounded, for the majority of their vertical extent, by semiconductor material which is doped with a first conductivity type; and
   a termination structure which surrounds said array, and which includes a final dielectric trench containing permanent charge:
   wherein said final dielectric trench is surrounded by said material of said first conductivity type, and wherein doping of said material tapers off laterally to a junction, and said material outside of said junction is predominantly of a second conductivity type.

2. The device of claim 1, wherein said permanent charge is provided by immobile cesium ions.

3. The device of claim 1, wherein said termination structure further comprises a field plate.

4. The device of claim 1, wherein said termination structure extends out toward the edge of the semiconductor material in which said device is built.

5. The device of claim 1, wherein said termination structure includes at least one diffused guard ring.

6. The device of claim 1, wherein said first conductivity type is p-type, and said termination structure includes at least one p-type ring diffusion.

7. The device of claim 1, wherein said junction is predominantly vertical.

8. The device of claim 1, wherein said first conductivity type is p-type.

9. The device of claim 1, wherein said trenches within said array include conductive gate electrodes.

10. The device of claim 1, wherein some of said trenches within said array include conductive gate electrodes, and others of said trenches within said array do not.

11. A high-voltage solid-state device, comprising:
    an array of active device portions, containing at least some trenches which include gate electrodes, and
    have added permanent charge therein, and
    are laterally surrounded, for the majority of their vertical extent, by semiconductor material which is doped with a first conductivity type and is capacitively coupled, at least in part, to ones of said gate electrodes; and
    a termination structure which surrounds said array, and which includes a final dielectric trench which contains permanent charge and which has approximately the same depth as said trenches in said array:
    wherein said final dielectric trench is surrounded by said material of said first conductivity type, and wherein doping of said material tapers off laterally to a predominantly vertical junction, and said material outside of said junction is predominantly of a second conductivity type.

12. The device of claim 11, wherein said first conductivity type is p-type, and said termination structure includes at least one p-type ring diffusion.

13. The device of claim 11, wherein some of said trenches within said array include conductive gate electrodes, and others of said trenches within said array do not.

14. A high-voltage solid-state device, comprising:
    an array of active device portions, containing
    first trenches which have added permanent charge, and contain conductive gate electrodes, and are laterally surrounded, for at least some of their vertical extent, by semiconductor material which is doped with a first conductivity type; and also source diffusions of a second conductivity type, at least partly overlying said semiconductor material which laterally surrounds ones of said first trenches; and second trenches which are different from said first trenches; and a termination structure which laterally surrounds said array, and which includes a final dielectric trench which is also surrounded by said material of said first conductivity type, and wherein doping of said material tapers off laterally to a substantially vertical junction, and wherein said termination structure also contains peak-field-reducing structures outside said junction.

15. The device of claim 14, wherein said final trench is structurally similar to said first trenches, but not said second trenches.

16. The device of claim 14, wherein said final trench is structurally similar to said second trenches, but not to said first trenches.

17. The device of claim 14, wherein said termination structure includes at least one diffused guard ring.

18. The device of claim 14, wherein said first conductivity type is p-type, and said termination structure includes at least one p-type ring diffusion.

19. The device of claim 14, wherein said junction is vertical for the depth of said first trenches.

* * * * *